(12) United States Patent
DeBone et al.

(10) Patent No.: US 8,847,614 B2
(45) Date of Patent: Sep. 30, 2014

(54) ELECTRICAL COMBINER BOX WITH IMPROVED FUNCTIONALITY

(71) Applicants: Christopher Robert DeBone, Aiea, HI (US); Steven Peter Godmere, Millilani, HI (US)

(72) Inventors: Christopher Robert DeBone, Aiea, HI (US); Steven Peter Godmere, Millilani, HI (US)

(73) Assignee: E Gear LLC, Aiea, HI (US)

( * ) Notice: Subject to any disclaimer, the term of this patent is extended or adjusted under 35 U.S.C. 154(b) by 104 days.

(21) Appl. No.: 13/769,121

(22) Filed: Feb. 15, 2013

(65) Prior Publication Data

US 2013/0207678 A1   Aug. 15, 2013

Related U.S. Application Data

(60) Provisional application No. 61/633,716, filed on Feb. 15, 2012.

(51) Int. Cl.
*G01R 27/08* (2006.01)
*G01R 21/06* (2006.01)
*H05K 7/02* (2006.01)
*G01R 31/40* (2014.01)
*G01R 21/133* (2006.01)

(52) U.S. Cl.
CPC *G01R 21/06* (2013.01); *H05K 7/02* (2013.01); *G01R 31/405* (2013.01); *G01R 21/133* (2013.01)
USPC .......................... 324/713; 324/600; 324/678

(58) Field of Classification Search
USPC ........... 324/509, 76.12, 76.11, 543, 520, 522, 324/67, 713, 521; 310/317, 316.01, 319, 310/334
See application file for complete search history.

(56) References Cited

U.S. PATENT DOCUMENTS

2010/0076714 A1* 3/2010 Discenzo ...................... 702/104
2013/0116846 A1* 5/2013 Galsim et al. ................. 700/295

* cited by examiner

*Primary Examiner* — Melissa Koval
*Assistant Examiner* — Trung Nguyen
(74) *Attorney, Agent, or Firm* — Keri Ann Krzykowski; Martin E. Hsia

(57) ABSTRACT

A combiner box capable of monitoring energy output from a photovoltaic system and having improved troubleshooting functionality, the ability to independently verify utility charges, and a mechanism for reducing incorrect readings of energy output and consumption due to noise and interference.

5 Claims, 3 Drawing Sheets

(Front / Interior View)

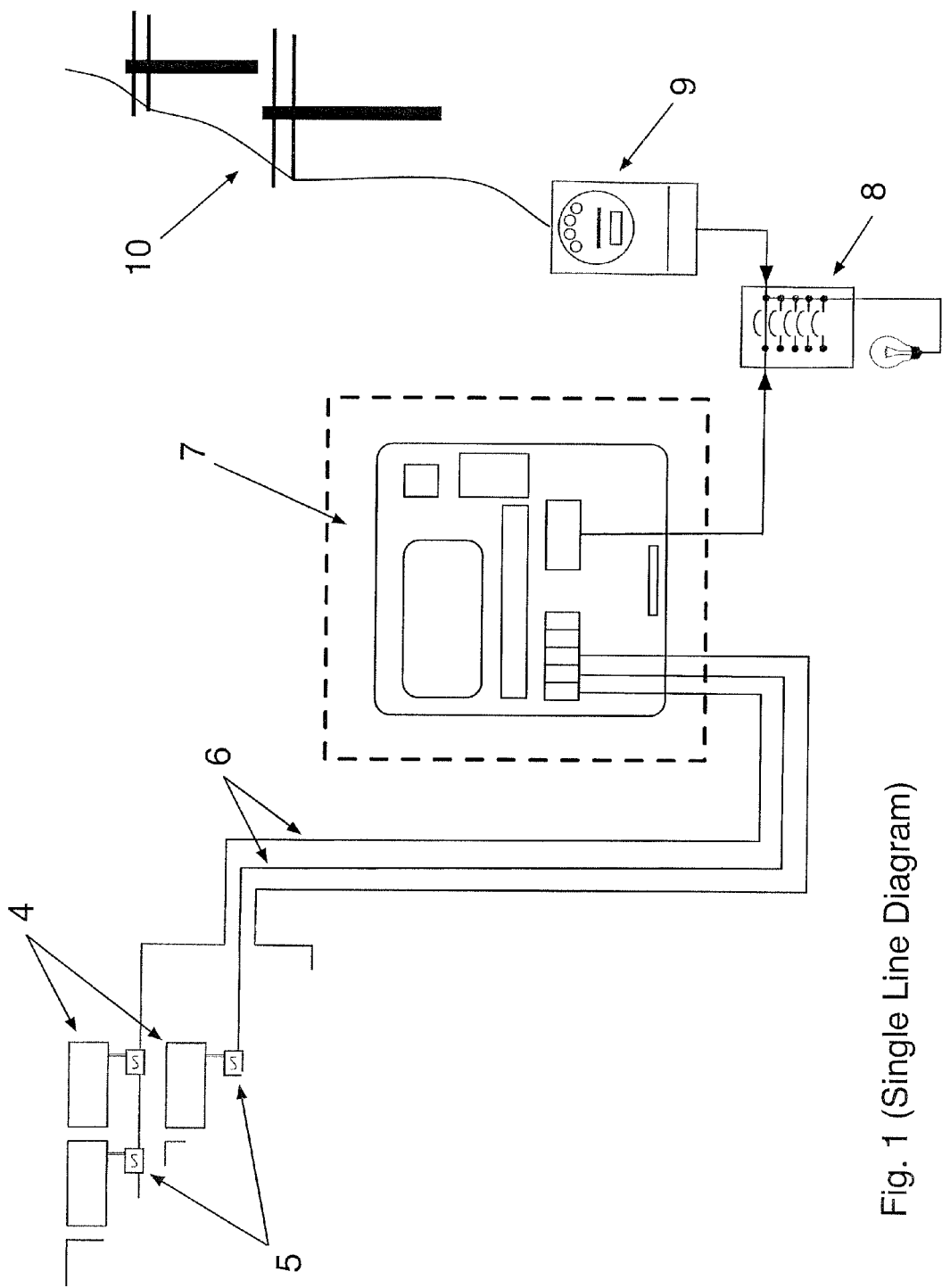
Fig. 1 (Single Line Diagram)

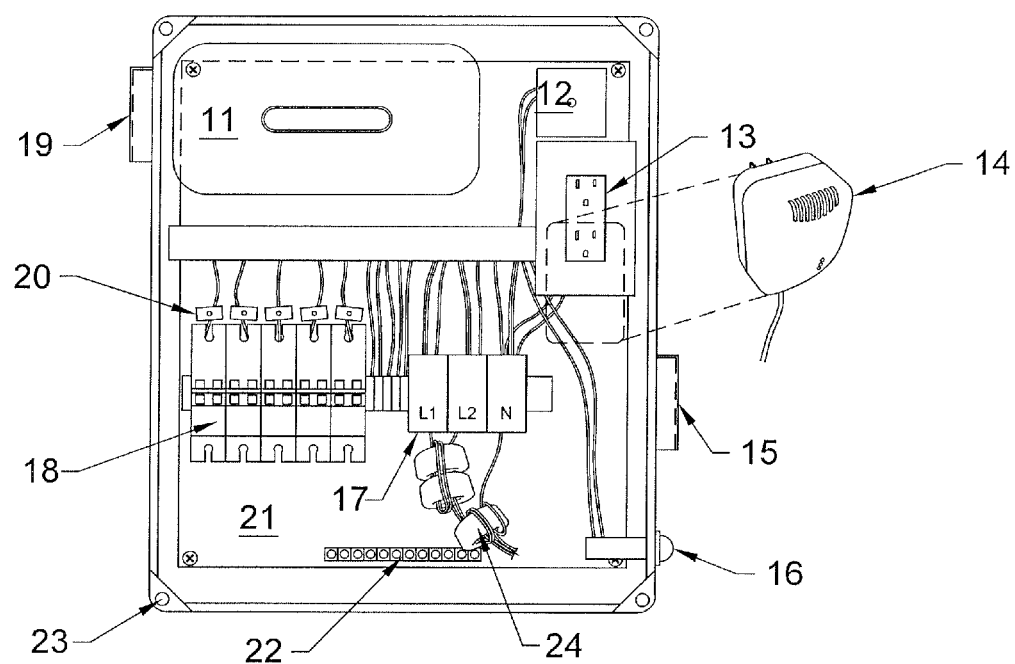
Fig. 2 (Front / Interior View)

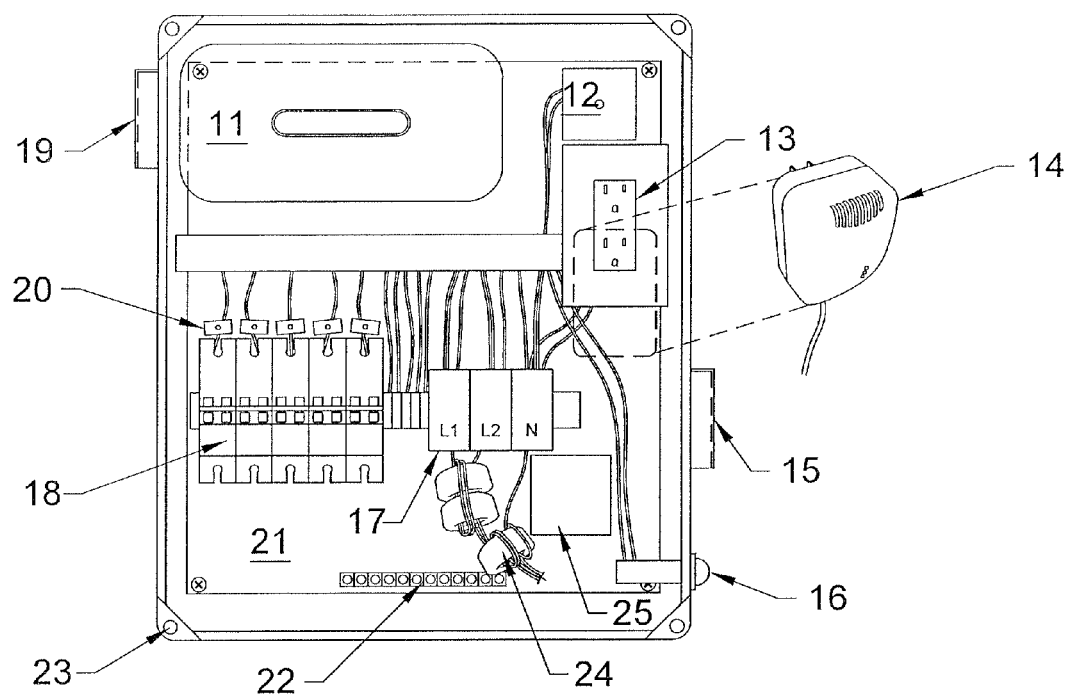
Fig. 3 (Front / Interior View)

US 8,847,614 B2

ELECTRICAL COMBINER BOX WITH IMPROVED FUNCTIONALITY

This application claims the priority of U.S. provisional patent application No. 61/633,716 filed Feb. 15, 2012.

TECHNICAL FIELD

The present invention relates generally to combiner boxes used in photovoltaic systems and other alternative energy systems that are connected to a utility grid. More specifically, the invention is a combiner box capable of monitoring energy output from a photovoltaic system (or other alternative energy system) having improved troubleshooting functionality, the ability to independently verify utility charges, and a mechanism for reducing incorrect readings of energy output and consumption due to noise and interference from other energy monitoring devices on connected circuits (including other PV systems that are connected through the utility grid) and household electronics.

BACKGROUND ART

Photovoltaic (PV) systems and other alternative energy systems are becoming increasingly popular as the prices of oil and other conventional energy sources continue to increase. However, alternative energy systems are expensive and have operational issues that present several time-consuming problems for installers and consumers. For example, the use of energy monitoring devices to monitor the performance and output of PV systems is well-known, however, these devices are usually positioned inside a home or building near an Internet connection and far from the solar panels of a PV system. Therefore, these devices often give incorrect readings (false readings or false data) due to external noise from household electronics (including but not limited to fluorescent lights, LED lights, dimmers, electronic equipment, home office equipment, and surge suppressors). Noise occurs when electrical devices and circuits give off undesirable electrical signals which disturb or impair other useful or desirable signals.

False readings can also occur from interference (or cross talk). Cross talk occurs when one energy monitoring device erroneously picks up data (monitoring signals) from another energy monitoring device on a connected circuit.

Both noise and cross talk can cause energy monitoring devices to give false readings, which leads to increased service calls for installers and increased time spent troubleshooting this issue.

PV systems that are used today also lack troubleshooting functionality and the ability for consumers to independently amounts charged by utilities for electricity.

Accordingly, it is an object of the present invention to provide a device that reduces or eliminates noise, cross talk, and other types of interference with household electronics and energy monitoring devices.

It is another object of the present invention to provide such a device that has improved troubleshooting functionality.

It is further object of the present invention to provide such a device that allows consumers to independently verify amounts of electricity provided by a utility company.

The following patents and patent applications may be considered relevant to the field of the invention:

U.S. patent application publication no. US 2012/0048328 A1 to Solon, incorporated herein by reference, discloses a system for monitoring and wireless transmitting solar array parameters such as current, voltage and temperature in real time while primarily housed within a recombiner box.

U.S. patent application publication no. US 2010/0053867 A1 to Dunn et al., incorporated herein by reference, discloses a system and method for measuring the performance of individual strings of PV modules in a PV array, including a string combiner box with integrated capability for measurement of string current versus voltage characteristic.

U.S. patent application publication no. US 2008/0147335 A1 to Adest et al., incorporated herein by reference, disclosing a monitoring system and method for monitoring performance of individual power sources in a distributed power source system. A monitoring module is coupled to each power source to monitor and collect data. The collected data is transmitted over a power line to central analysis station for analysis.

US patent application publication US 2011/0141644 A1 to Hastings et al., incorporated herein by reference, discloses a direct current arc fault circuit interrupter for a direct current combiner box.

US patent application publication US 2006/0237058 A1 to McClintock et al., incorporated herein by reference, discloses a direct current combiner box with power monitoring, ground fault detection and communications interface.

US patent application publication US 2011/0036386 A1 to Browder, incorporated herein by reference, discloses a fully integrated and self-contained AC photovoltaic solar panel having a compression connector fitting for electrically connecting to the utility grid.

The reference manual entitled "Troubleshooting an Enphase Microinverter System," published by Enphase Energy, Inc., incorporated herein by reference, discloses the use of ferrite beads to isolate an Envoy energy monitoring system from interference.

DISCLOSURE OF THE INVENTION

The above and other objects are preferably achieved by a device, comprising: a housing; power distribution blocks mounted in the housing for combining utility-compliant alternating current from a plurality of inverters, carried over wires containing monitoring signals from the inverters at a first monitoring frequency, to provide combined alternating current carrying the monitoring signals; wherein the combined alternating current is connected in parallel with alternating current from a utility grid at a utility connection to trigger the inverters to produce the utility-compliant alternating current; wherein the combined alternating current feeds power to the utility grid and a local load connected to the utility connection;

noise filters tuned to block interference with the first monitoring frequency, interposed between the power distribution blocks and the utility connection; and a power outlet box having at least two outlets electrically connected to one of the power distribution blocks, wherein a solar energy monitoring device can be plugged into one of the outlets and an internal Ethernet bridge adapter that is connected to the Internet can be plugged into another of the outlets, wherein the solar energy monitoring unit and the internal Ethernet bridge adapter can be connected for data transfer, wherein the power distribution blocks provide the combined alternating current to the solar energy monitoring device which extracts the monitoring signals as extracted monitoring signals, and wherein the internal Ethernet bridge adapter connected to the solar energy monitoring device communicates the extracted monitoring signals at a second monitoring frequency to a remote external Ethernet bridge adapter that is connected to a remote server;

whereby the noise filters reduce cross talk from other monitoring signals from other inverters, and noise from devices using the alternating current from the utility grid.

The device further comprises a home energy monitoring unit housed in the housing and connected to the solar energy monitoring unit for data transfer, operably connected to the local load to provide data on consumption by the local load of the combined alternating current and the alternating current from the utility grid, whereby independent verification of utility charges is achieved.

The device also further comprises an alternating current surge protector operably connected to the power distribution blocks.

The device still further comprises circuit breakers mounted in the housing to receive the utility-compliant alternating current containing the monitoring signals from the plurality of inverters. Current indicators operably connected to the circuit breakers indicate when the utility-compliant alternating current is delivered to the circuit breakers from the plurality of inverters.

BRIEF DESCRIPTION OF DRAWINGS

FIG. 1 is a schematic of a PV system that uses the present invention.

FIG. 2 is an elevational view from the front of the interior of a first presently preferred embodiment of the invention; and FIG. 3 is an elevational view from the front of the interior of a second presently preferred embodiment of the invention.

BEST MODE FOR CARRYING OUT THE INVENTION

Referring to FIG. 1, shown is a schematic of a PV system. One or more solar panels (solar photovoltaic modules) 4 on the roof of a home or building collect sunlight as direct current (DC). Inverters 5 (commonly called micro inverters) operably connected to the solar panels 4 convert the DC into alternating current (AC). The inverters 5 are connected together in "strings." The AC they produce is the form of electrical power that is used by homes and businesses.

The inverters 5 then transmit AC and monitoring signals (data on the performance and output of the inverters 5, including but not limited to total PV system energy production, inverter AC voltage, inverter AC current, and panel DC voltage) at a first monitoring frequency over wires 6 from the inverters 5 to the present invention 7.

The transmission of signals over power lines (such as wires 6) is well-known. Power line communication systems operate by transmitting modulated carrier signals over the same wires that carry power.

The AC produced by the inverters 5 preferably complies with all electric power requirements of the utility, such as voltage, waveform, and frequency (utility-compliant) and contains monitoring signals transmitted by the inverters 5.

The inverters 5 preferably generate and deliver AC only when they are connected in parallel to AC supplied from a utility grid 10. If the inverters 5 do not sense AC from the utility grid 10, they turn off and do not generate utility-compliant AC.

After the DC is converted to AC by the inverters, the AC and monitoring signals travel along one or more wires 6 to the present invention 7, which combines the utility-compliant AC from each string of inverters 5 to generate combined AC. The combined AC from the invention 7 thereafter feeds power to a utility meter 9 and utility grid 10. It also feeds power to a home power distribution panel 8 (local load). The utility meter 9, utility grid 10, and local load 8 are connected at a utility connection (not shown).

Referring to FIG. 2, shown is a first presently preferred embodiment of the invention comprising a combiner box 7, which preferably is lockable, weather resistant, corrosion resistant, and has upper and lower vents 15, 19 for ventilation through the box. The interior of the box has enclosure mounting holes 23 and a mounting plate 21 for mounting electrical components into the box. The box components, however, can be placed in the box in any manner that allows them to be securely retained therein.

The box preferably has circuit breakers 18, which receive the utility-compliant AC from the plurality (strings) of inverters 5 through the wires 6. The circuit breakers 18 protect the PV system from overload (excess current), short circuits, and other electrical malfunctions, which can lead to excessive generation of heat, fires, and other hazards. There is preferably one circuit breaker 18 for each string of inverters 5 in the PV system. Each circuit breaker 18 also preferably has a current indicator 20 (such a LED light) operably connected to it. Each current indicator 20 preferably turns on to confirm its connected circuit breaker 18 is receiving utility-compliant AC current from the connected string of inverters 5. The current indicators 20 assist installers in determining which string of inverters is malfunctioning when the PV system is not producing enough power.

Power distribution blocks 17 combine the utility-compliant AC (traveling from the circuit breakers 18, or directly from the inverters) into combined AC. The combined AC then travels out of the box 7 to power the utility grid 10 and a home power distribution panel (local load) 8, as shown in FIG. 1.

Referring back to FIG. 2, noise filters 24 (such as ferrite toroids or ferrite rings), which suppress high frequency noise in electrical circuits, are preferably placed in the combiner box 7 between the power distribution blocks 17 and the utility connection (i.e. the local load 8 and the utility grid 10). The noise filters are specially tuned to block interference at the first monitoring frequency that is used by the inverters 5 to communicate with a solar energy monitoring device 11 (such as the Enphase Envoy Monitoring System). The noise filters 24 reduce cross talk from other monitoring signals given off by other inverters in connected circuits, and reduce noise from other household devices that are using the AC from the utility grid 10.

A power outlet box 13 is preferably electrically connected to at least one of the power distribution blocks 17. The internal Ethernet bridge adapter 14 (such as Netgear Powerline wall-plugged AC Ethernet adapter Bridge) and the solar energy monitoring device 11 are preferably connected to the power outlet 13. The solar energy monitoring device 11 is operably connected to the internal Ethernet bridge adapter 14 via Universal Serial Bus (USB) or other ports located on the Ethernet bridge adapter 14 and the solar energy monitoring device 11 for data transfer. The present invention also preferably positions the solar energy monitoring device 11 within the box 7, instead of within the home, to reduce the problems of data loss over distance and false data due to noise from household electronics.

The power distribution blocks 17 provide AC (carrying the monitoring signals at a first monitoring frequency) to the solar energy monitoring device 11. The solar energy monitoring device 11 preferably extracts the monitoring signals (data) from the wires in the box 7 and sends the extracted monitoring signals to the internal Ethernet bridge adapter 14 which is connected to the Internet. Thereafter, the internal Ethernet bridge adapter 14 sends the extracted monitoring signals at a second monitoring frequency to a remote external Ethernet bridge adapter (not shown) (such as Netgear Powerline wall-plugged AC Ethernet adapter Bridge) that is connected to the Internet and a remote server (not shown) so that the monitoring signals (data) can be accessed and viewed by consumer through a website, mobile app, or other similar means. Preferably, the second monitoring frequency is distinctly different from the first monitoring frequency so that the noise filters 24 in the box will not block any communication at the second monitoring frequency.

The present invention also preferably includes a prominent external indicator light 16, which quickly confirms if the combiner box is receiving voltage from the utility grid so that the inverters 5 can turn on and deliver AC.

A surge protector device 12 operably connected to the combiner blocks is preferably included in the combiner box 7 to suppress any severe transient electrical activity through the box.

An equipment ground wire bus bar 22, typically a strip, bar, or hollow tube made of copper, brass, or aluminum, is also preferably located in the combiner box to help conduct electricity and prevent electric shock on non-current carrying metallic parts of the box. These are often necessary to meet electrical safety code requirements.

Referring to FIG. 3, shown is a second presently preferred embodiment of the invention, which is identical to first embodiment, but adds a home energy monitoring unit 25 (such as the Energy Detective TED 5000, PowerSave, Inc. Current Cost, or Energy Circle eMonitor). Preferably, the home energy monitoring unit 25 is connected to the solar energy monitoring device 11 via USB or other ports, and monitors and records the energy consumption of a home or building. Alternately, the home energy monitoring unit 25 can be connected directly to the internal Ethernet bridge adapter via USB or other ports. The home energy monitoring unit 25 is preferably located within the box 7, instead of within the home, to reduce the problem of noise from household electronics, and it is operably connected to the local load 8.

The data from the home energy monitoring unit 25 is preferably combined with the monitoring signals from the solar energy monitoring device 11 and transmitted by the internal Ethernet bridge adapter 14 over the Internet to a remote external Ethernet bridge adapter (not shown) connected to the Internet and a remote server (not shown) so that the data can be accessed and viewed by a consumer through a website, mobile app, or other similar means.

The home energy monitoring unit 25 allows consumers to independently verify utility charges by determining the differences between the amount of energy generated by the PV system (which is recorded by the solar energy monitoring device 11) and the amount of energy consumed by the home (which is recorded by the home energy monitoring unit 25).

Although the presently preferred embodiment is described in connection with a PV system (photovoltaic system), it can be used in connection with any system that combines multiple sources of AC electricity.

While the present invention has been disclosed in connection with the presently preferred embodiments described herein, it should be understood that there may be other embodiments which fall within the spirit and scope of the invention as defined by the claims. Accordingly, no limitations are to be implied or inferred in this invention except as specifically and as explicitly set forth in the claims.

INDUSTRIAL APPLICABILITY

This invention can be used whenever it is necessary or desirable to monitor the output of a PV system (or other alternative energy system) while improving trouble shooting capabilities and reducing the time consuming problems associated with noise and cross talk.

The invention claimed is:

1. A device, comprising:
a housing;
power distribution blocks mounted in said housing for combining utility-compliant alternating current from a plurality of inverters, carried over wires containing monitoring signals from said inverters at a first monitoring frequency, to provide combined alternating current carrying said monitoring signals;
wherein said combined alternating current is connected in parallel with alternating current from a utility grid at a utility connection to trigger said inverters to produce said utility-compliant alternating current;
wherein said combined alternating current feeds power to said utility grid and a local load connected to said utility connection;
noise filters tuned to block interference with said first monitoring frequency, interposed between said power distribution blocks and said utility connection; and
a power outlet box having at least two outlets electrically connected to one of said power distribution blocks, wherein a solar energy monitoring device can be plugged into one of said outlets and an internal Ethernet bridge adapter that is connected to the Internet can be plugged into another of said outlets, wherein said solar energy monitoring unit and said internal Ethernet bridge adapter can be connected for data transfer, wherein said power distribution blocks provide said combined alternating current to said solar energy monitoring device which extracts said monitoring signals as extracted monitoring signals, and wherein said internal Ethernet bridge adapter connected to said solar energy monitoring device communicates said extracted monitoring signals at a second monitoring frequency to a remote external Ethernet bridge adapter connected to a remote server;
whereby said noise filters reduce cross talk from other monitoring signals from other inverters, and noise from devices using said alternating current from said utility grid.

2. A device according to claim 1, further comprising a home energy monitoring unit housed in said housing and connected to said solar energy monitoring unit for data transfer, operably connected to said local load to provide data on consumption by said local load of said combined alternating current and said alternating current from said utility grid, whereby independent verification of utility charges is achieved.

3. A device according to claim 1, further comprising an alternating current surge protector operably connected to said power distribution blocks.

4. A device according to claim 1, further comprising circuit breakers mounted in said housing to receive said utility-compliant alternating current containing said monitoring signals from said plurality of inverters.

5. A device according to claim 4, further comprising current indicators operably connected to said circuit breakers to indicate when said utility-compliant alternating current is delivered to said circuit breakers from said plurality of inverters.

* * * * *